United States Patent [19]
Tobita

[11] Patent Number: 4,571,503
[45] Date of Patent: Feb. 18, 1986

[54] SUPPLY VOLTAGE LEVEL INDEPENDENT CLOCK GENERATOR

[75] Inventor: Youichi Tobita, Itami, Japan

[73] Assignee: Mitsubishi Denki Kabushiki Kaisha, Tokyo, Japan

[21] Appl. No.: 502,597

[22] Filed: Jun. 9, 1983

[30] Foreign Application Priority Data

Jul. 7, 1982 [JP] Japan ................. 57-119361

[51] Int. Cl.⁴ ............. H03K 5/135; H03K 3/33; H03K 17/284; H03K 17/693
[52] U.S. Cl. .................... 307/269; 307/449; 307/491; 307/594; 307/601; 307/605; 307/578
[58] Field of Search ......... 307/269, 270, 480, 491, 307/582, 583, 584, 590, 591, 592, 594, 597, 262, 601, 602, 603, 605, 449, 463, 482, 578, 481

[56] References Cited

U.S. PATENT DOCUMENTS

| | | | |
|---|---|---|---|
| 3,778,784 | 12/1973 | Karp et al. | 307/262 X |
| 3,969,706 | 7/1976 | Proebsting et al. | 340/173 R |
| 4,090,096 | 5/1978 | Nagami | 307/269 |
| 4,239,991 | 12/1980 | Hong et al. | 307/262 |
| 4,275,313 | 6/1981 | Boll et al. | 307/448 |
| 4,443,714 | 4/1984 | Nakano et al. | 307/269 |
| 4,447,745 | 5/1984 | Takamae et al. | 307/269 |
| 4,472,643 | 9/1984 | Furuyama | 307/269 |
| 4,472,644 | 9/1984 | Kirsch | 307/269 |

*Primary Examiner*—Larry N. Anagnos
*Attorney, Agent, or Firm*—Lowe, King, Price & Becker

[57] ABSTRACT

A clock generator (21) for use in a random access memory includes a delay circuit (35) for delaying an input signal for a predetermined time, independent of supply voltage level. The generator (21) includes a driver circuit (34) responsive to the delayed input signal and at least one constant-resistance transistor (48, 50). The transistor (48, 50) has a control electrode supplied with a predetermined constant voltage independent of the power supply voltage for providing a high ON resistance that is also independent of the power supply voltage. Through operation of the constant-resistance transistor (48, 50) the delay time of the delay circuit (35) and thus the clock signal is made independent of any variation in the power supply voltage.

8 Claims, 9 Drawing Figures

PRIOR ART

SUPPLY VOLTAGE LEVEL INDEPENDENT CLOCK GENERATOR

BACKGROUND OF THE INVENTION

1. Field of the Invention

This invention relates to a clock generator suitable for use with circuits operating under control of clock signals.

2. Description of the Prior Art

A conventional application of such a clock generator is, for example, a dynamic random access memory circuit (RAM) as shown in FIG. 1. Another example of a RAM different from that in FIG. 1 is illustrated in FIG. 2 as will be discussed later.

In FIG. 1, each of single bit memory cells 1 consists of a storage capacitor 2 for storing "1" or "0" data and a switching transistor 3 for reading, writing or holding the data in the storage capacitor 2. Switching on and off the respective one of the switching transistors 3 is controlled by a control signal fed via the corresponding one of word lines 5. The data read from the respective memory cells 1 pass through a common bit line 4. The data in the bit lines 4 are amplified by a sense amplifier 6. A respective one of decoders 7 as defined by a phantom line selects one of a plurality ($2^n$ in the illustrated example) of the memory cells 1 connected to the common bit line 4. In the respective decoder 7, a terminal 8 is supplied with an address signal $A_1, \overline{A}_1, A_2, \overline{A}_2, \ldots, A_n, \overline{A}_n$ (these are sometimes collectively referred to as "A"). Each of transistors 9 works in response to the address signal A applied thereto. A line 10 is a first output line of the decoder 7, a terminal 11 is one which is supplied with a pre-charge signal $\phi$ for pre-charging the output line 10, and a terminal 13 is a power terminal. A transistor 12 is a switching transistor for pre-charging the output node 10. In response to a level at the output node 10, a transistor 14 couples with the word line 5 a clock output signal $\phi_2$ fed via a line 15 from a clock generator 21. Address buffer circuits 17 shown at the extreme left of the drawing are responsive to an address input signal $a_1$-$a_n$ assigning the address of the respective memory cell 1 to generate a pair of complementary address signals $A_1, \overline{A}_1$-$A_n, \overline{A}_n$. A signal $\phi_1$ which enables the address buffer circuit 17 is supplied via a respective terminal 20. The output signal of the address buffer circuit 17 is outputted from two output terminals 18 and 19. The signal $\phi_1$ is also fed via a terminal 22 to the clock generator 21 which generates the clock output signal $\phi_2$ to enable the decoders 7.

Referring to the waveforms of the respective signals $\phi$, $\phi_1$, $A_1$, $\overline{A}_1$-$A_n$, $\overline{A}_n$, x, $\phi_2$ and $a_1$-$a_n$ as depicted in FIG. 3, operation of the RAM of FIG. 1 will now be described.

During the period when the pre-charge signal $\phi$ is "1", the outputs of the respective address buffer circuits 17 are "0". When the pre-charge signal $\phi$ goes to "0", the signal $\phi_1$ goes to "1" so that the address signals $A_1, \overline{A}_1, \ldots, A_n, \overline{A}_n$, that is, the outputs of the address buffer circuits 17 are determined by the address inputs $a_1$-$a_n$. Those address signals A from the address buffer circuits 17 are fed to the respective decoders 7.

Assume now that the address inputs $a_1$-$a_n$ all are "0" and that the address signals $A_1$-$A_n$ are "0" with $\overline{A}_1$-$\overline{A}_n$ being "1".

In such a case, all of the output lines 10 in the plurality of the decoders 7 pre-charged with the pre-charge signal $\phi$ except the uppermost of the decoders in FIG. 1 are discharged to "0" response to the address signals A. This is because the address signals $\overline{A}_1$-$\overline{A}_n$ of a "1" level are provided to all of the decoders 7 except the uppermost of the decoders 7.

Since under these circumstances only the transistor 14 in the uppermost of the decoders 7 is turned ON, when the clock output signal $\phi_2$ goes to "1" a voltage is supplied only to the word line 5 in the uppermost memory 1 by way of that transistor 14 so that a data is read from that designated memory cell 1 via the bit line 4. The sense amplifier 6 then amplifies the data to complete reading the data from the memory.

Then the clock output signal $\phi_2$ is generated by the clock generator 21 when discharging of the output lines 10 in the respective decoders 7 is almost over. The reason is that, provided that the clock output signal $\phi_2$ is developed before discharging the respective output lines is completed, the clock output signal $\phi_2$ is fed with all of the transistors 14 being in the ON state so that the word lines other than those duly addressed by the address inputs $a_1$-$a_n$ are supplied with a voltage to select memory cells 1 other than the duly addressed one (i.e. multiplex selection). Should the length of time from the completion of data reading from the memory to the development of the clock output signal $\phi_2$ be extended, the memory would not face the above discussed problem but would require a long time to complete data reading after being addressed (that is, long access time). It is therefore most desirable that the clock output signal $\phi_2$ be generated immediately after the output nodes 10 of the decoders 7 have been discharged.

FIG. 4 is a circuit diagram showing in detail an example of the conventional clock generator 21 schematically depicted in FIG. 1. In FIG. 4, the signal $\phi_1$ is applied to terminals 31 and the pre-charge signal $\phi$ to a terminal 33, while the clock output signal $\phi_2$ is delivered from an output terminal 32. A driver circuit section 34 and a delay circuit section 35 are denoted by the phantom line, respectively. A transistor 36 in the driver circuit section 34 is a charging transistor for the output of the driver circuit and another transistor 37 is a discharging transistor therefor. A boosting capacitor 38 is to boost the voltage at node 40, decrease the ON resistance of the charging transistor 36 and increase the charging speed. A transistor 39 is to shut off supply of the signal $\phi_1$ to the node 40 during voltage boosting. A transistor 42 in the delay circuit section 35 is one for discharging an output line 41 from the delay circuit 35, while another transistor 43 is one for charging the output line 41. Furthermore, a transistor 44 is to discharge a charging line 46 and another transistor 45 is to charge the charging line 46. A power supply terminal is denoted by 47.

Within the above circuit arrangement, the output terminal 32, the charging line 46 and the node 40 are held "0" and the output line 41 is held "1" when the pre-charge signal $\phi$ is "1". At the moment where the signal $\phi_1$ goes to "1", the node 40 is brought up to a "1" level but the output terminal 32 is still held at a "0" level due to a ratio of the ON resistances of the charging and discharging transistors 36 and 37 since the output line 41 is still at a "1" level. Upon receipt of the signal $\phi_1$ assuming the "1" level, the transistor 45 is turned ON and the voltage at the charging line 46 changes from "0" to "1". As soon as the charging line 46 goes to the "1" level, the transistor 42 starts turning ON and the voltage at the output line 41 starts dropping from the "1" level to the "0" level. If the voltage level at the output line 41 drops below the threshold voltage of the discharging transistor 37, then the discharging transistor 37 is turned OFF and the voltage at the output terminal 32 starts rising. In other words, the clock output signal $\phi_2$ begins appearing.

The length of time extending from the time when the signal $\phi_1$ becomes "1" to that when the clock output signal $\phi_2$ begins appearing is dependent upon the operation time of the delay circuit section 35. Therefore, through adjustment of the delay time of the delay circuit section 35, an improved RAM circuit is attained which operates at high speed without multiplex selection.

For RAM circuits, it is generally required to operate normally within about ±10% fluctuations of the power voltage V supplied thereto. The delay time should therefore be determined in consideration of such fluctuations of the power voltage V.

Insofar as the discharging timing of the decoders 7 and the developing timing of the clock output signal $\phi_2$ from the clock generator 21 have the same dependency on the power voltage, timing selection may be made with any suitable power voltage. However, the same dependency is not easily available due to dispersion of pattern layouts on chips. In particular, the discharge time of the decoders 7 is primarily determined by the resistance of aluminum lines, N+ diffusion resistances and so forth which are not dependent upon the power supply voltage V, whereas the delay time of the clock generator 21 is primarily determined by the resistance of MOS transistors which are dependent upon the power supply voltage V.

In FIG. 5 the power voltage dependency of the discharge time $t_1$ of the decoders 7 and the power voltage dependency of the delay time $t_2$ of the clock output signal $\phi_2$ are plotted with the solid lines I and II, respectively. As shown herein, the dependencies I and II are such selected that $t_1$ is equal to $t_2$ at a normal value V of the power supply voltage. It is noted that the operation times of both the circuits tend to decrease with increase in the power supply voltage V.

It is evident from FIG. 5 that $t_1 > t_2$ with a power voltage higher than the normal value V and the clock output signal $\phi_2$ is developed prior to discharging of the decoders, thus faulty operation of the RAM is caused by the multiplex selection of the memory cells 1.

To avoid this, the dependencies I and II may be selected such that $t_1 = t_2$ at the +10% point A as suggested by the dot line in FIG. 5. In this case the reading speed of the RAM becomes slow because the clock output signal $\phi_2$ is developed with a delay t.

SUMMARY OF THE INVENTION

This invention is directed to a clock generator which is connected to a power source and adapted to provide a clock output signal of a predetermined delay time with respect to an input signal.

The clock generator embodying the present invention comprises a delay circuit for delaying an input signal applied thereto a predetermined time; said delay circuit including at least one constant-resistance transistor supplied with a given voltage independent of variations in a power voltage supplied to a control electrode, said constant-resistance transistor making the predetermined delay time of said delay signal independent of variations in the power voltage; and a driver circuit operatively connected to said delay circuit for providing a clock output signal delayed with respect to the input signal.

Accordingly, it is the primary object of the present invention to provide a clock generator in which a clock output signal is developed with a timing independent of variations of power supply voltage.

The above object and other objects and advantages of the present invention will be more clearly understood from the following description with respect to the accompanying drawings.

DESCRIPTION OF THE PREFERRED EMBODIMENTS

Figure 6:
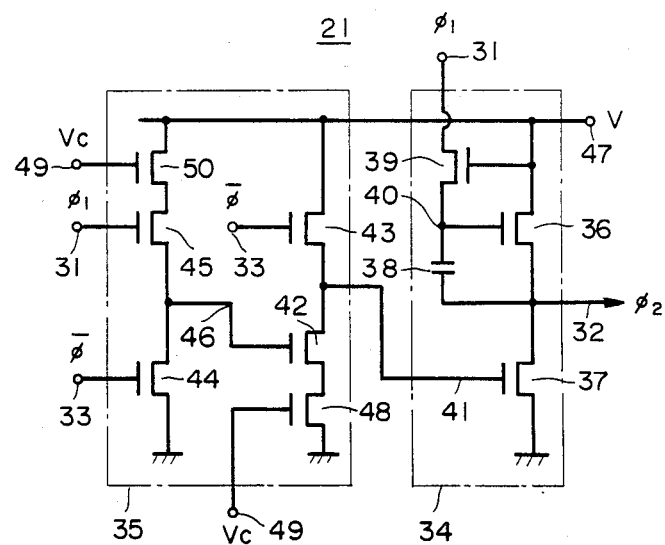
FIG. 6 is a circuit diagram showing a clock generator according to a preferred embodiment of the present invention.

FIG. 6 is a circuit diagram showing a clock generator according to a preferred embodiment of the present invention. In this illustrated embodiment, circuit description will be made in terms of N channel MOS transistors in a conventional circuit. It is however obvious that the present invention should not be limited to the N channel MOS transistors but is applicable equally to P channel MOS transistors. In other words, the present invention is applicable to a wide range of clock generators employing insulated gate type field effect transistors. Various specific values including voltages and so forth are shown to give a better understanding of the present invention, though they are of no direct concern in the gist of the present invention.

Figure 2:
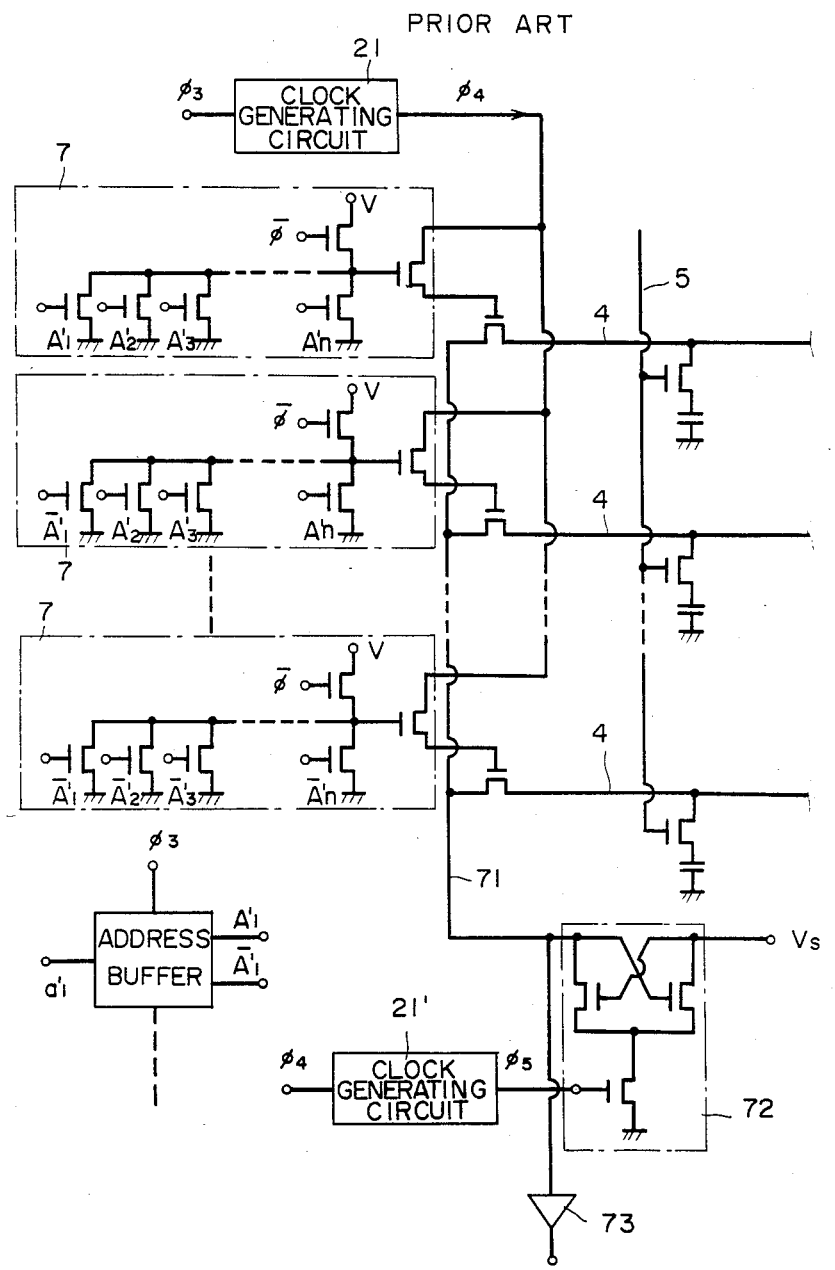
FIG. 2 shows another example of the random access memory circuit as an alternative application of the clock generator.
Figure 3:
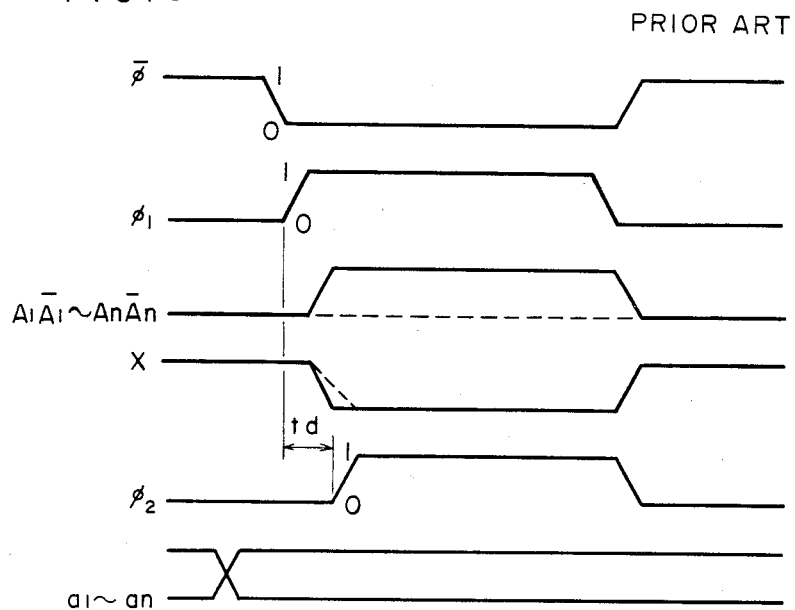
FIG. 3 is a waveform diagram showing various signals appearing in the random access memory circuit.
Figure 4:
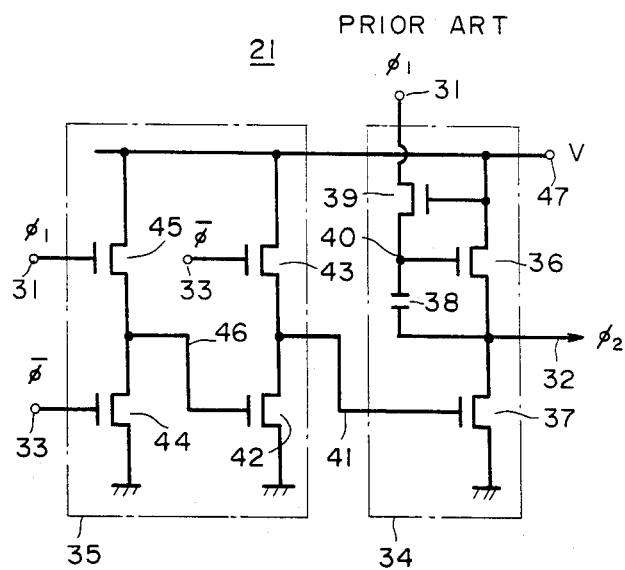
FIG. 4 is a circuit diagram showing in detail a conventional clock generator 21 schematically illustrated in FIG. 1.

In FIG. 6, components similar to those in FIG. 2 are identified by the same reference numbers. Only the distinction of the embodiment of FIG. 6 over that of FIG. 2 will be discussed below. A transistor 48 is connected between the output line 41 from the delay circuit section 35 and the ground and a transistor 50 between a power supply source and the charging line 46. Gate terminals 49 of the respective transistors 48 and 50 are supplied with a constant voltage $V_c$. It is noted that the constant voltage $V_c$ is unvariable regardless of variance of the power supply voltage V and may be higher or lower than the power supply voltage V.

The following will describe operation of the above circuit arrangement.

Figure 5:
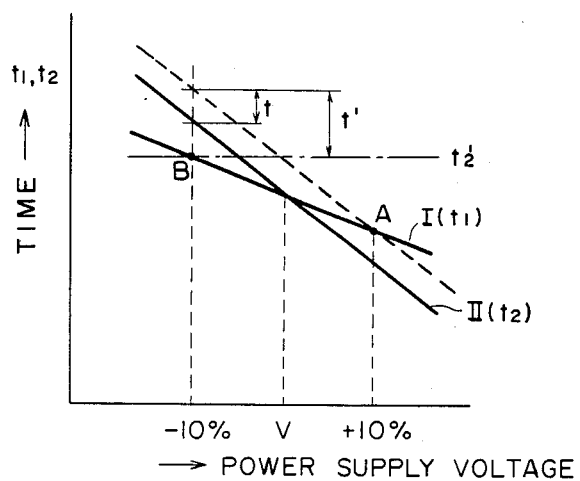
FIG. 5 shows power voltage dependency I of a discharge time $t_1$ of decoders 7 and power voltage dependency II of a delay time $t_2$ of a clock output signal $\phi_2$.

In FIG. 6 provided that the ON resistance of the transistor 50 is sufficiently higher than that of the transistor 45, the charging time of the charging line 46 is determined by only the ON resistance of the transistor 50. Furthermore, provided that the ON resistance of the transistor 48 is selected to be sufficiently higher than that of the transistor 42, the discharge time of the output line 41 is determined by only the ON resistance of the transistor 48. Since both the transistors 48 and 50 are supplied with a constant voltage $V_c$ independent of the power supply voltage V, no variations in the ON resistances thereof are viewed even if the power supply voltage V varies. Thus the delay time independent of the power supply voltage V is made available. If the dependencies I and II are selected so as to assure $t_1 = t_2$ at the point B equivalent to $-10\%$ of the power supply voltage V as depicted by the phantom line in FIG. 5 through the utilization of the above mentioned fixed delay time, it is possible to speed up the reading time by a time $t'$ as compared with the conventional circuit as represented by the dot line.

Figure 7:
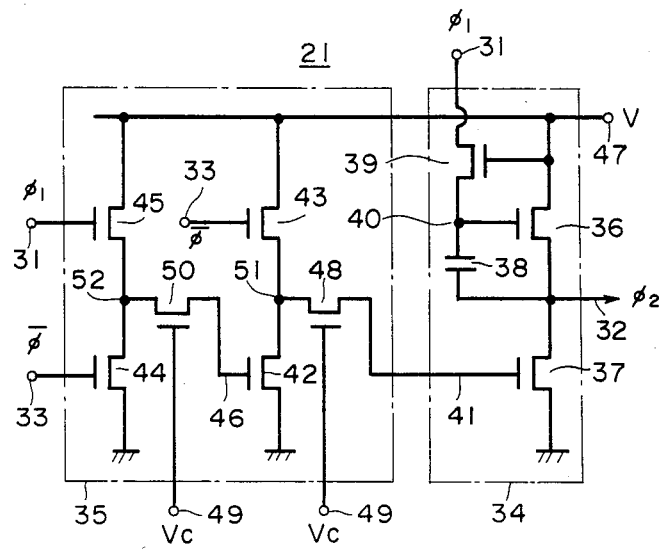
FIG. 7 is a circuit diagram showing a clock generator according to another preferred embodiment of the present invention.

FIG. 7 is a circuit diagram showing a clock generator according to another preferred embodiment of the present invention. Components in FIG. 7 similar to those in FIG. 2 are identified by the same reference numbers. Only the components different from those in FIG. 2 will be described. A transistor 48 is connected between an output node 51 of an inverter consisting of transistors 42 and 43 and the output line 41, and another transistor 50 between an output node 52 of an inverter consisting of transistors 44 and 45 and the charging line 46. Gate terminals 49 of the respective transistors 48 and 50 are fed with constant voltage $V_c$. In the embodiment as illustrated in FIG. 7, the clock output signal $\phi_2$ which is delayed independently of variance in the power supply voltage is made available as in the embodiment of FIG. 6 provided that the ON resistances of the transistors 48 and 50 are selected to be sufficiently higher than those of the transistors 42 and 45 and the gates of the transistors 48 and 50 are supplied with the constant voltage $V_c$ to make the discharge time dependent only upon the transistors 48 and 50.

Figure 8:
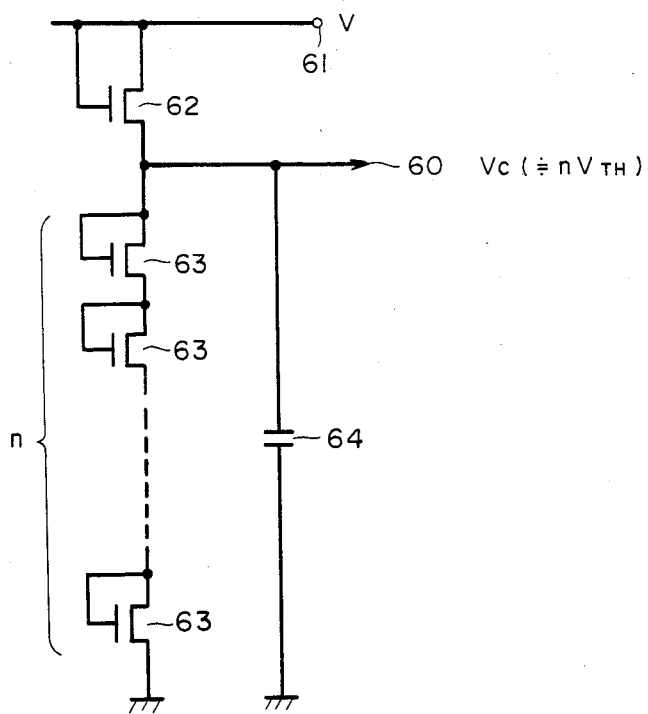
FIG. 8 is a circuit diagram showing a preferred example of a circuit for use in the practice of the present invention for generation of a constant voltage $V_c$.

FIG. 8 shows a preferred example of a circuit for use in the practice of the present invention for generation of the constant voltage $V_c$. In FIG. 8, a terminal 60 is an output terminal from which the constant voltage $V_c$ is delivered and a terminal 61 is a power supply terminal to which the power supply voltage V is applied. A transistor 62 disposed between the power supply and output terminals is a transistor for supply of an output voltage, and has a drain and a gate connected to each other. A plurality of transistors 63 connected serially between the output terminal and the ground are to provide the constant voltage, with each having a drain-to-gate connection. A capacitor 64 is a decoupling capacitor for stabilizing the output voltage level.

Should the resistance of the transistor 62 be sufficiently higher than those of the transistors 63 in the above circuit arrangement, the constant voltage $V_c$ is determined by the threshold voltage $V_{TH}$ of the transistors 63 and approximately equal to $nV_{TH}$ in the case where the number of the transistor 63 is n. This value does not vary even if there is a slightest variation of the power supply voltage V.

Whereas the foregoing has so far discussed the word line selection circuit in the RAM controlled with the clock signals, it is also obvious that the present invention is further applicable to other circuits under control of clock signals.

Figure 9:
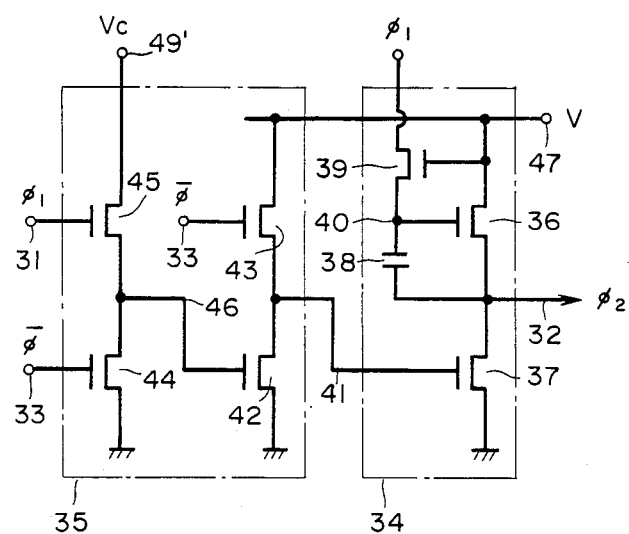
FIG. 9 is a circuit diagram showing a clock generator according to still another preferred embodiment of the present invention.

FIG. 9 is a circuit diagram showing a clock generator according to still another preferred embodiment of the present invention. Components in FIG. 9 similar to those in FIG. 2 are likewise identified by the same reference numbers. In the embodiment of FIG. 9, a terminal 49' is connected to the constant voltage $V_c$. Thus the constant voltage $V_c$ is supplied to a gate electrode of the transistor 42 to make the ON resistance of the transistor 42 independent of the power supply voltage V. Therefore, the same advantage as in the embodiment of FIG. 6 is also expected in this further alternative embodiment.

Figure 1:
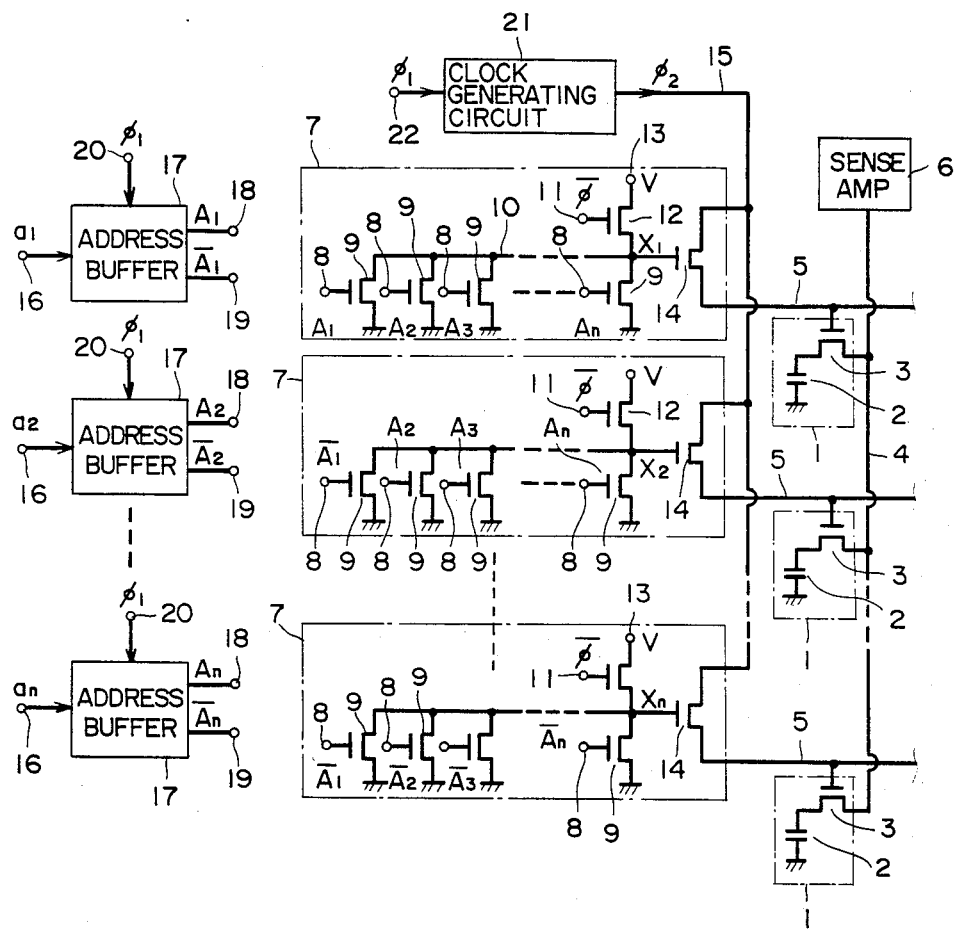
FIG. 1 shows an example of a random access memory circuit as a typical application of a clock generator.

Referring back to FIG. 2, another example of RAM different from that in FIG. 1 is illustrated containing the decoders 7 for selection of the bit lines and another conventional clock generator 21 which controls the decoders 7. Components in FIG. 2 similar to those in FIG. 1 are identified by the same reference numbers. In the RAM, if the circuit 21 develops a clock signal $\phi_4$ before the outputs of the respective decoders 7 have been discharged, data from non-selected bit lines 4 are read out via an I/O line 71. In FIG. 2, there are further illustrated an output amplifier circuit 72 and an amplifier 73 for amplifying the data read out via the I/O line 71. The data read out via the I/O line 71 are amplified after comparison with a reference voltage by the output amplifier circuit 72. If a clock signal $\phi_5$ from a clock generator 21' being responsive to the signal $\phi_4$ to control the same in timing is developed too early, then the differential voltage between the data read out and the reference voltage $V_s$ becomes insufficient and the RAM may conduct faulty operation because of inappropriate inversion of the output of the output amplifier circuit 72.

As long as the clock generator 21 embodying the present invention is employed to generate the respective signals $\phi_4$ and $\phi_5$, stable and reliable reading of the data is assured without slowdown of speed of data reading as is obvious from the foregoing description.

As discussed in detail in the foregoing, the present invention provides a circuit which performs high speed and accurate operation regardless of variations in the power supply voltage, since the operation time of the delay circuit section for use in the clock generator is controlled with the constant voltage independent of the power supply voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clock generator connected to a power supply and adapted to receive an input signal and provide a clock output signal of a predetermined delay time with respect to the input signal applied thereto, said clock generator comprising:
   a delay circuit responsive to said input signal to provide a delay signal of a predetermined delay time;
   said delay circuit including at least one constant-resistance transistor supplied at its control electrode with a constant voltage independent of variations in the power supply voltage and exhibiting an ON resistance independent of said power supply voltage, said constant-resistance transistor serving to make the predetermined delay time of said delay signal substantially independent of variations in said power supply voltage, and a drive circuit operatively connected to said delay circuit to provide said clock output signal.

2. A clock generator connected to a power supply and adapted to receive an input signal and provide a clock output signal of a predetermined delay time with respect to the input signal applied thereto, said clock generator comprising:

a delay circuit responsive to said input signal to provide a delay signal of a predetermined delay time;

said delay circuit having at least one constant-resistance transistor supplied at its control electrode with a constant voltage independent of variations in the power supply voltage and exhibiting an ON resistance independent of said power supply voltage, said constant-resistance transistor serving to make the delay time of said delay signal substantially independent of variations in said power supply voltage, and a drive circuit operatively connected to said delay circuit to provide said clock output signal;

wherein said delay circuit comprises:

a first series connection including a first constant-resistance transistor and a first transistor, one end of said first series connection being connected to said power supply and a control electrode of said first transistor being supplied with said input signal;

a second transistor connected at a second junction between the other end of said series connection and a reference potential;

a third transistor having an electrode connected to said power supply; and a second series connection including a second constant-resistance transistor and a fourth transistor, said second series connection being connected at a first junction between another electrode of said third transistor and said reference potential and a control electrode of said fourth transistor being connected to the other end of said first series connection, wherein said delay signal is delivered from the first junction of said third transistor and said second series connection.

3. A clock generator according to claim 2 wherein the ON resistance of said first constant-resistance transistor is sufficiently higher than the ON resistance of said first transistor and/or the ON resistance of said second constant-resistance transistor is sufficiently higher than the ON resistance of said fourth transistor such that charging of the second junction and/or discharging of said first junction is determined by only the ON resistance(s) of said first and/or second constant-resistance transistors, respectively.

4. A clock generator connected to a power supply and adapted to receive an input signal and provide a clock output signal of a predetermined delay time with respect to the input signal applied thereto, said clock generator comprising:

a delay circuit responsive to said input signal to provide a delay signal of a predetermined delay time;

said delay circuit having at least one constant-resistance transistor supplied at its control electrode with a constant voltage independent of variations in the power supply voltage and exhibiting an ON resistance independent of said power supply voltage, said constant-resistance serving to make the delay time of said delay signal substantially independent of variations in said power supply voltage, and a drive circuit operatively connected to said delay circuit to provide said clock output signal;

wherein said delay circuit comprises:

a first transistor having an electrode connected to said power supply and a control electrode to which said input signal is applied;

a second transistor connected between another electrode of said first transistor and a reference potential;

a third transistor having an electrode connected to said power supply;

a fourth transistor connected between another electrode of said third transistor and said reference potential;

a first constant-resistance transistor connected between said another electrode of said first transistor and a control electrode of said fourth transistor; and a second constant-resistance transistor having an electrode connected to a junction of said third transistor with said fourth transistor and another electrode from which said delay signal is delivered.

5. A clock generator according to claim 4 wherein the ON resistance of said first constant-resistance transistor is sufficiently higher than the ON resistance of said first transistor such that charging is dependent on only the first constant-resistance transistor and/or the ON resistance of said second constant-resistance transistor is sufficiently higher than the ON resistance of said fourth transistor such that discharging is dependent on only said second constant-resistance transistor.

6. A clock generator connected to a power supply and adapted to receive an input signal and provide a clock output signal of a predetermined delay time with respect to the input signal applied thereto, said clock generator comprising:

a delay circuit responsive to said input signal to provide a delay signal of a predetermined delay time;

said delay circuit having at least one constant-resistance transistor supplied at its control electrode with a constant voltage independent of variations in the power supply voltage and exhibiting an ON resistance independent of said power supply voltage, said constant-resistance transistor serving to make the delay time of said delay signal substantially independent of variations in said power supply voltage, and a drive circuit operatively connected to said delay circuit to provide said clock output signal;

wherein said delay circuit comprises:

a first transistor having an electrode connected to a constant voltage independent of said power supply voltage and a control electrode to which said input signal is applied;

a second transistor connected between another electrode of said first transistor and a reference potential;

a third transistor having an electrode connected to said power supply; and a fourth transistor connected between another electrode of said third transistor and said reference potential, a control electrode of said fourth transistor being connected to another electrode of said first transistor as to be supplied with said constant voltage, so that said fourth transistor acts as a constant-resistance transistor.

7. A clock generator connected to a power supply and adapted to receive an input signal and provide a clock output signal of a predetermined delay time with respect to the input signal applied thereto, said clock generator comprising:

a delay circuit responsive to said input signal to provide a delay signal of a predetermined delay time;

said delay circuit having at least one constant-resistance transistor supplied at its control electrode with a constant voltage independent of variations in the power supply voltage and exhibiting an ON resistance independent of said power supply voltage, said constant-resistance transistor serving to make the delay time of said delay signal substantially independent of variations in said power supply voltage; and a drive circuit operatively connected to said delay circuit to provide said clock output signal;

wherein said delay circuit comprises:

a first transistor having an electrode connected to said power supply and a control electrode to which said input signal is applied;

a second transistor connected between another electrode of said first transistor and a reference potential;

a third transistor having an electrode connected to said power supply; and a series connection of a constant-resistance transistor and a fourth transistor, said series connection being connected at a first junction between another electrode of said third transistor and said reference voltage potential and a control electrode of said fourth transistor being connected to said electrode by said first transistor, and fourth transistor being driven by a second junction between said first and second transistors;

wherein said delay signal is delivered from a junction of said third transistor with said series connection.

8. A clock generator according to claim 7 wherein the ON resistance of said constant-resistance transistor is sufficiently higher than the ON resistance of said fourth transistor such that discharge of said first junction is determined by only the ON resistance of said constant-resistance transistor.

* * * * *